United States Patent [19]

Dillinger et al.

[11] Patent Number: 4,553,047
[45] Date of Patent: Nov. 12, 1985

[54] REGULATOR FOR SUBSTRATE VOLTAGE GENERATOR

[75] Inventors: Thomas E. Dillinger, Madison, Wis.; Terrance W. Kueper, Rochester, Minn.

[73] Assignee: International Business Machines Corporation, Armonk, N.Y.

[21] Appl. No.: 456,145

[22] Filed: Jan. 6, 1983

[51] Int. Cl.[4] ............................................. H03L 1/00
[52] U.S. Cl. ..................................... 307/297; 307/304
[58] Field of Search ........... 307/200 A, 200 B, 296 R, 307/297, 304; 323/273–274

[56] References Cited

U.S. PATENT DOCUMENTS

| | | | |
|---|---|---|---|
| 4,004,164 | 1/1977 | Cranford, Jr. et al. | 307/297 |
| 4,049,980 | 9/1977 | Maitland | 307/297 X |
| 4,152,716 | 5/1979 | Torii et al. | 307/296 R X |
| 4,439,692 | 3/1984 | Beekmans et al. | 307/297 |
| 4,446,383 | 5/1984 | Concannon et al. | 307/297 |
| 4,446,384 | 5/1984 | Taira | 307/297 |
| 4,471,290 | 9/1984 | Yamaguchi | 307/297 X |

*Primary Examiner*—Stanley D. Miller
*Assistant Examiner*—D. R. Hudspeth
*Attorney, Agent, or Firm*—J. Michael Anglin

[57] ABSTRACT

A regulated on-chip substrate-voltage generator circuit converts a single power supply input and ground potential into a negative potential. The negative potential is applied to the substrate of an integrated circuit upon which the substrate-voltage generator is formed. The substrate voltage generator includes a voltage oscillator connected to a charge pump device. A pair of depletion FETs forms a voltage divider circuit between the ground potential and the substrate potential. An amplifier, formed from depletion FETs, couples the voltage divider into the charge pump. The voltage divider and amplifier regulate the charge pump thereby maintaining tight control over the substrate voltage.

5 Claims, 6 Drawing Figures

REGULATOR FOR SUBSTRATE VOLTAGE GENERATOR

BACKGROUND OF THE INVENTION (a) Field of the Invention

The present invention relates to integrated circuit technology in general and more particularly relates to the use of FET devices to form substrate voltage generators on an integrated circuit chip.

(b) Prior Art

The fabrication of electrical devices from integrated circuit technology is well known in the prior art, and includes functional units such as Random Access Memory (RAM), Read Only Memory (ROM), gate arrays, programmable logic arrays (PLA), etc. These devices generally consist of a plurality of electrical components and/or functional units on a substrate. The substrate with its electrical components and/or units is often referred to as a chip.

One of the important characteristics of a chip is that a relatively large number of electrical circuits are placed on a relatively small surface area. In an attempt to economize on the system power supplies and or chip I/O pins, only a single voltage source is usually made available to the chip. Usually, the voltage source is positive and is stubbed onto a designated pin on the chip. For most applications, both a positive and a negative voltage level is needed on the chip. The negative voltage level is used to bias the substrate of the chip.

In order to generate the negative supply voltage, the prior art uses an on-chip voltage generator. U.S. Pat. No. 4,208,595 is an example of a prior-art on-chip voltage generator. The voltage generator consists of an FET circuit which applies the principle of voltage doubling to a first capacitor to achieve a predetermined voltage magnitude across a second capacitor. The voltage on the second capacitor is inverted and is coupled into the substrate of the chip.

An article entitled, "Substrate Voltage Generator Circuit," published in the IBM Technical Disclosure Bulletin, Vol. 21, No. 2, July 1978 (pages 727–728), describes an FET circuit for generating a negative voltage on a chip. The circuit includes two capacitors, a diode, two switching devices and a clock signal. The capacitors, diode and switching devices are connected so that when the clock is in its high state, a current path leads from ground through the switching devices, the capacitors and the diode into the substrate. This path provides the negative voltage to the substrate.

One of the problems which plagues the prior art on-chip generators is that the generated voltage is susceptible to wide variation having an adverse effect on the performance of the chip. The prior art adopts several techniques to control the generated voltage.

One of the prior-art techniques is the so-called threshold-voltage compensation technique. In this technique, circuitry is provided to maintain tight control over the threshold voltage of a reference FET. U.S. Pat. No. 4,049,944 is an example of this prior-art technique. In the patent a pair of FETs generate a reference voltage which is supplied to a sensing circuit consisting of FETs. One of the FETs of the sensing circuit is designated the control FET. The referenced voltage is applied to the base of the controlled FET. The sensing circuit senses the threshold voltage across the controlled FET and generates a control voltage in response to the threshold voltage. A regulating circuit utilizes the control voltage to vary a current through a resistor. The current is used to bias the substrate voltage, thereby compensating for variations in the threshold voltage.

Another example of prior-art threshold-voltage compensation technique is given in an article entitled, "FET N-Channel Threshold Voltage-Control Circuit", published in the IBM Technical Disclosure Bulletin, Vol. 17, No. 1, June 1974 (p. 140). In the article a pair of FET devices establishes a reference voltage. The reference voltage controls the threshold voltage of another FET device. When the threshold voltage is below the reference level, the substrate bias is made more negative.

In yet another prior-art technique, the substrate voltage of the chip is regulated. An article entitled, "Sentry Circuit for Substrate Voltage Control," published in Vol. 15, No. 2, July 1972 (pp. 478–479), is an example of this technique. A multivibrator circuit generates a square wave. A bias voltage control circuit rectifies the square wave and supplies a negative voltage to the substrate. A pair of enhancement FETs is connected between the supply voltage and the substrate. The pair of enhancement FETs form a voltage divider whose output voltage is used to regulate the output of the bias voltage control circuit.

In still another technique the substrate voltage generator is regulated by a capacitive voltage divider connected between substrate voltage and ground. This technique is described in an article entitled, "Feedback Substrate Bias Generator," published in the IBM Technical Disclosure Bulletin, Vol. 23, No. 5, October 1944 (pp. 1930–1931).

For overall power and performance control, compensation theoretically would be preferred over regulation. However, compensation requires a large overall range of substrate voltages, especially with state-of-the-art FETs having a low variation in threshold voltage with changing substrate voltage. Generation of a sufficiently wide range of substrate voltages taxes the current capability of feasible generator circuits, and leads to circuit problems such as device breakdown at high voltages and leakage at low voltages. Regulation provides substrate-voltage control with a much narrower range of generated voltages.

In the prior art, the regulator voltage divider was connected between the supply voltage and the substrate. Supply-voltage variations were therefore propagated into the reference voltage which controls the substrate generator. In another configuration, capacitive voltage dividers are used, but these block D.C. current from entering the substrate. The flow of D.C. current into the substrate minimizes negative voltage drift in the substrate and forces the substrate to operate around its quiescent voltage level.

SUMMARY OF THE INVENTION

It is therefore a general object of the present invention to provide a better substrate voltage generator than was heretofore possible.

It is another object of the present invention to provide a substrate voltage generator which maintains tight control over the substrate voltage of an FET integrated circuit device.

The substrate voltage generator is formed on the substrate of the FET device and includes a regulator stabilizing an oscillator/charge-pump generator. The regulator includes a voltage divider coupled to a high gain amplifier. The voltage divider is coupled between ground and the substrate voltage ($-V_{sx}$) and generates a referenced voltage which is amplified by the high-gain amplifier. The referenced voltage is used to control the charge pump. The regulator is fabricated from depletion FETs. Additionally, the voltage divider forms a D.C. current path between ground and the substrate.

The foregoing and other features and advantages of the invention will be apparent from the following more particular description of the preferred embodiment of the invention, as illustrated in the accompanying drawings.

DETAILED DESCRIPTION OF THE PREFERRED EMBODIMENT

Figure 1:
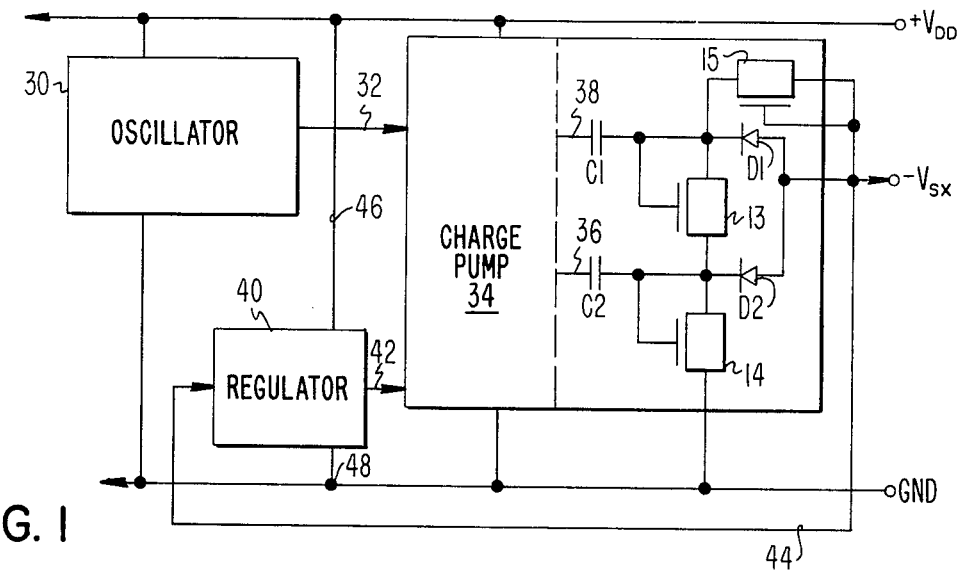
FIG. 1 shows a block diagram of an improved substrate voltage regulator according to the teachings of the present invention.

FIG. 1 shows a block diagram of the substrate voltage generator according to the teaching of the present invention. The substrate voltage generator is comprised of a conventional ring-type oscillator 30. The oscillator is coupled to a supply voltage ($+V_{dd}$) and a ground (GND) potential. The output of the oscillator 30 is fed over conductor 32 into charge pump means 34. Because ring type oscillator is well known in the prior art the details will not be given. Suffice it to say that oscillator 30 is a free running oscillator and generates a symmetrical square wave output.

The charge pump means 34 accepts the square wave signal on conductor 32 and generates a negative voltage ($-V_{sx}$) which is supplied to the substrate of a semiconductor chip. To this end, the charge pump is coupled to $+V_{dd}$ and ground. The output of the charge pump is connected to node $-V_{sx}$ of the substrate. Details of the charge pump will be given hereinafter. Suffice it to say at this point that the charge pump generates complementary output signals on capacitors C1 and C2 respectively. The complementary signal on conductor 36 charges C2 to one-half the charge on C1. Likewise, the signal on conductor 38 charges C1 to some predetermined value. When the substrate voltage ($-V_{sx}$) falls to a level below the quiescent operating voltage level of the substrate, capacitor C1 is discharged through FET devices 12 and 15 (FIG. 3) respectively to restore the substrate to its quiescent operating voltage level. The charges which are depleted from C1 are replaced on C1 by transferring charge from C2.

The degree to which the charge pump is allowed to discharge the substrate is controlled by regulator 40. The regulator 40 has its output connected to the input of charge pump by conductor 42. Conductor 44 connects the input of the regulator to the substrate voltage $-V_{sx}$. Conductors 46 and 48, respectively, interconnect the regulator between supply voltage ($+V_{dd}$) and ground potential. The regulator (to be described hereinafter) is comprised of a voltage dividing means and an amplifying means. The voltage dividing means generates the referenced voltage which is amplified by the amplifying means and is supplied on conductor 42. The referenced voltage is set in accordance with the feedback voltage of the substrate on conductor 44. If the substrate voltage is operating within the quiescence operating level, then the output from regulator 40 keeps charge pump 44 from discharging/charging the substrate $-V_{sx}$. If the substrate voltage is outside of its operating range, then the signal on conductor 42 adjusts the amplitude of the charge pump signal which in turn discharges/charges the substrate to a predetermined quiescent operating voltage.

Figure 3:
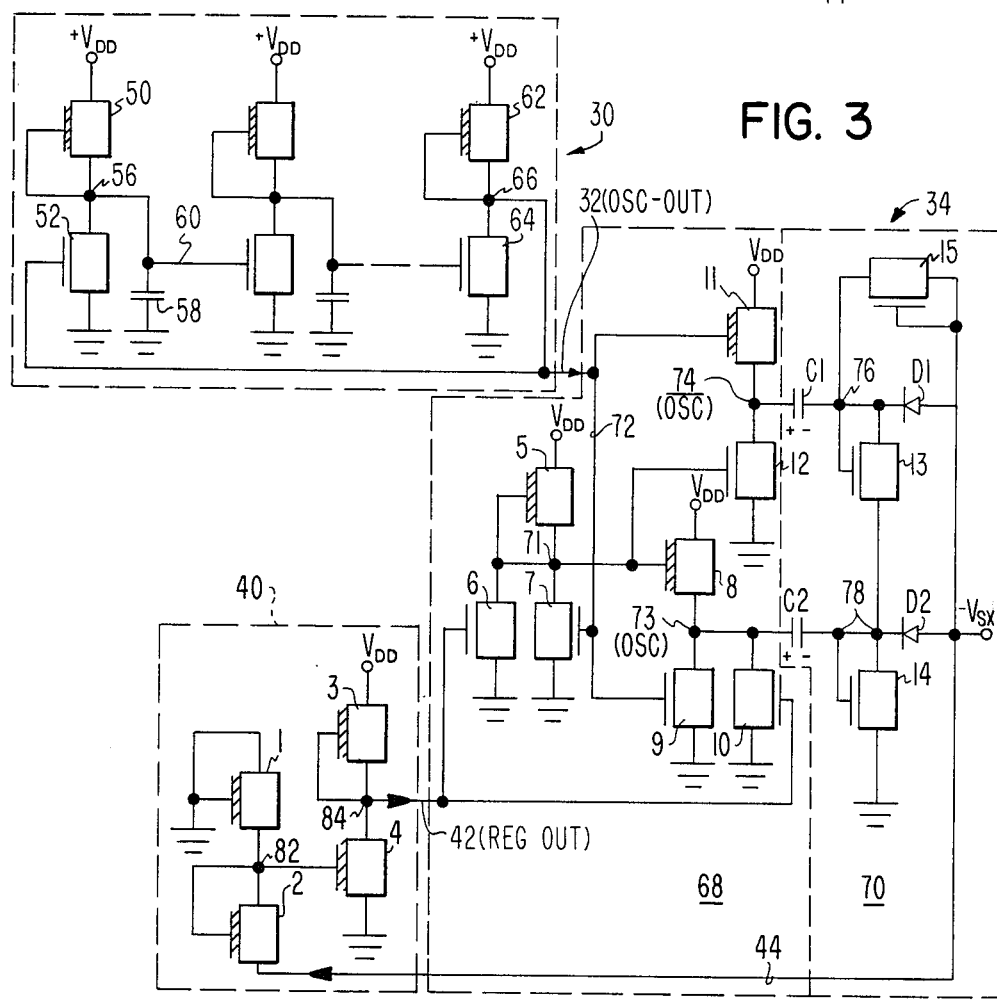
FIG. 3 is a more detailed schematic of the electrical circuits used in FIG. 1.

Referring now to FIG. 3, the details for the regulator, oscillator and charge pump are shown. In order to simplify the description, elements in FIG. 3 which are common to elements previously described in FIG. 1 are identified by common numerals. The oscillator 30 is a ring oscillator formed by a plurality of serially connected stages of FET devices. Each stage of the device is identical; therefore, only the first stage will be described. A typical stage of the device is formed by FET devices 50 and 52 respectively. In the preferred embodiment the FET device 50 is a depletion mode FET device and is coupled between supply voltage $+V_{dd}$ and node 56. FET device 52 is an enhancement mode device and is coupled between node 56 and ground. A capacitor 58 is connected between node 56 and ground. Assume that FET devices 50, 52 and capacitor 58 form stage 1 of the oscillator. The output of stage 1 is fed over conductor 60 to stage 2. Similarly, stage 2 is fed into stage 3 (not shown) and so on until stage N (formed by FET devices 62 and 64) outputs a voltage signal on conductor 66, which is fed back to state 1. In the preferred embodiment of this invention, the ring oscillator is free running at a frequency F approximately 4 mHz. The output on conductor 66 is a symmetrical square wave operating between a down level approximately 0 volts and an up level approximately $V_{dd}$ volts. Of course, other types of oscillators can be used without departing from the scope of the present invention.

The output from oscillator 30 is coupled by conductor 32 to charge pump 34. Charge pump 34 is comprised of a charge pump amplifier means identified by numeral 68 and a voltage doubler means identified by numeral 70. FET devices 5, 7, 8 and 9 comprise a push/pull inverting buffer which generates "$\overline{osc}$" signal at node 73. Device 5 is coupled between node 71 and supply voltage $V_{dd}$. Device 7 is coupled between node 71 and ground. Conductor 72 connects the output of oscillator 30 to device 7 and 9, respectively. Device 9 is connected between node 73 and ground. Device 8 is connected between supply voltage $V_{dd}$ and node 3. Similarly, devices 5, 7, 11 and 12 comprise a push/pull noninverting buffer which generates a complementary "osc" signal at node 74. Device 11 is connected between supply voltage $V_{dd}$ and node 74. Device 12 is coupled between node 74 and ground. FET devices 6 and 10 directly control the amplitude of the "$\overline{osc}$" signal at node 73 and indirectly control the amplitude of the "osc" signal at node 74. To this end FET device 6 is connected between node 71 and ground, while the gate electrodes of FET devices 6 and 10 are tied to conductor 42. As stated previously, conductor 42 couples the output of regulator means 40 to the charge pump. The voltage-doubler means 70 includes coupling capacitors C1 and C2 respectively. Capacitor C1 is connected to node 74 and capacitor C2 is connected to node 73. A diode D1 interconnects capacitor C1 to the substrate voltage ($-V_{sx}$).

Diode D1 is poled so that it conducts current away from the substrate $-V_{sx}$. An FET device 15 interconnects node 76 (capacitor C1) with the substrate voltage $-V_{sx}$. FET device 15 is connected in parallel with diode D1. In the preferred embodiment of this invention FET devices 13 and 15 are FET diodes, i.e. FETs connected to function as diodes. FET diode 13 is coupled between node 76 and node 78 and couple C1 and C2. Node 78 is connected to the negative plate of capacitor of C2, while the positive plate of capacitor C2 is connected to node 73. FET device 14 is coupled between node 78 and ground. In the preferred embodiment of this invention FET device 14 is an FET diode. Diode D2 interconnects the voltage substrate ($-V_{sx}$) to node 78. The diode D2 is poled in a manner similar to that of D1.

Still referring to FIG. 3, the substrate voltage $-V_{sx}$ is fed over conductor 44 into regulator 40. As stated previously, regulator 40 senses the voltage on the substrate and generates a reference voltage which is used to control the charge pump so that the voltage of the substrate operate within a narrow range about the quiescent substrate voltage level. To this end, the regulator 40 includes FET device 1 connected between ground potential and node 82. FET device 2 is connected between node 82 and the substrate voltage ($-V_{sx}$) FET device 3 is connected between supply voltage $V_{dd}$ and output node 84. FET device 4 is connected between node 84 and ground potential.

As stated before, the signal on output node 84 controls the charge pump which in turn regulates the substrate voltage $-V_{sx}$. In the preferred embodiment of this invention, devices 1, 2, 3 and 4 are depletion-mode FET devices. Preferably, devices 1 and 2 perform a voltage dividing function with components which enable direct current to flow between the ground and the substrate. It should be noted that, normally, D.C. leakage current into the substrate is attempted to be avoided. However, it can in fact be used to advantage. If transient current (from any circuit) couples the substrate capacitance to a more negative value, the D.C. current, from devices 1 and 2, into the substrate provides recovery to the quiescent substrate voltage faster than from leakage currents alone. Additionally, the D.C. current into the substrate reduces any negative drift the substrate voltage $-V_{sx}$ may experience. To this end, FET devices 1 and 2 form a voltage dividing network of the resistive type. More specifically, devices 1 and 2 are FET resistors. The feedback of voltage $-V_{sx}$ from the substrate and the sizes of the resistors determine the reference voltage which the resistive network generates at node 82.

Devices 3 and 4 form a high-gain amplifier and couple the reference voltage at node 82 into the charge pump 34. As can be seen from FIG. 3, as the substrate voltage ($-V_{sx}$) becomes more negative, node 84 becomes more negative and eventually $V_{gs}-V_T$ for device 4 approaches zero and turns off device 4. With device 4 off, the regulator output rises and inhibits the charge pump from further discharging the substrate. If the substrate voltage $-V_{sx}$ moves toward zero or ground potential, then the regulator regulates the amplitude of the "osc" and "$\overline{osc}$" signals at nodes 74 and 73 to bring the substrate voltage into satisfactory operating range.

Figure 4A:
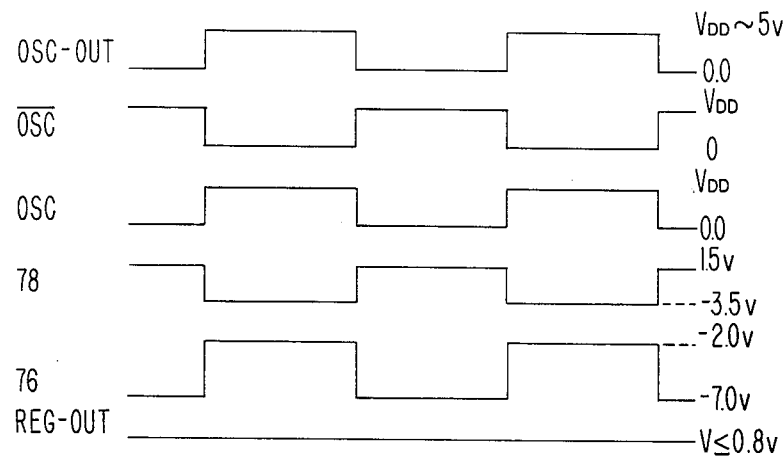
FIG. 4A–4C shows a series of curves which are helpful in understanding the operation of the improved substrate voltage regulator.
Figure 4B:
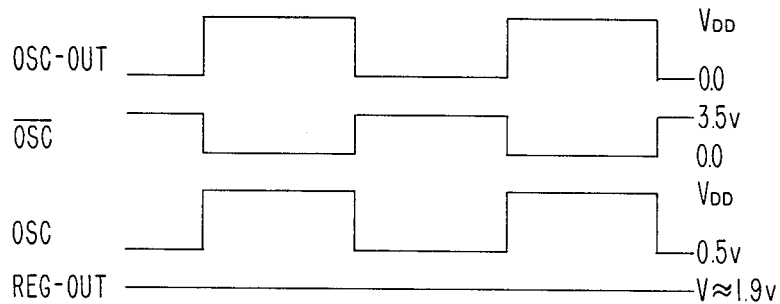
Figure 4C:
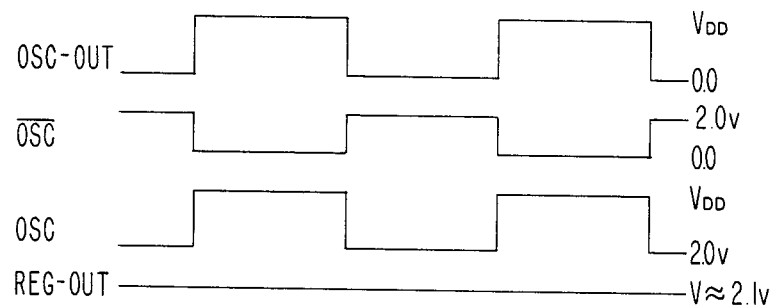

FIGS. 4A–4C show a series of curves which are used to explain the operation of the substrate voltage regulator. To simplify the description, specific numbers are used. However, this should not be construed as a limitation on the scope of the present invention since it is within the skill of the art to change the value without departing from the scope of the present invention. Each curve in the figures represents the signals at various nodes in FIG. 3. With reference to FIG. 4A, the top most plot, identified as OSC-OUT, represents the voltage signal which is output from oscillator 30 on conductor 32. The range of this signal is from 0 volts to $V_{dd}$. OSC represents the signal at node 73, which is generated from the inverting buffer section of charge pump 34. The plot identified as oscillator (OSC) represents the voltage at node 74. The plots identified by numerals 76 and 78 respectively represent the voltage signals appearing at nodes 76 and 78 in FIG. 3. The regulator output (REG OUT) on conductor 42 fluctuates between zero and $V_{dd}$ volts.

FIG. 4A assumes that REG-OUT is at a "down" level. As stated before, control devices 6 and 10 (FIG. 3) are therefore off and both "osc" and $\overline{osc}$ are running at full amplitude. Also let $VC1 = V_{\overline{osc}} - V_{76}$. And $V_2 = V_{osc} - V_{78}$. $V_{76}$ represents the voltage a node 76 and $V_{78}$ represents the voltage at node 78. Devices 13 and 14 each form an FET diode whose forward drop is equal to the threshold of the respective device plus some small added voltage to sustain current flow. Assume $V_{Forward\ 13} = V_{Forward\ 14} = 1.5$ v. Capacitors C1 and C2 along with devices 13 and 14 comprise a voltage doubler. Assume $V_{sx}$ is very negative and that diode D1 and device 15 do not conduct. Each time $\overline{osc}$ rises to 5 volts, capacitor C2 is charged to 3.5 volts $(5-1.5)$.

When $\overline{osc}$ falls to 0 volts, node 78 is forced to $-3.5$ volts by capacitor C2. At the same time oscillator (osc) rises to 5 volts. Capacitor C1 ultimately charges to 7 volts $(5-1.5-(-3.5))$. This means that, with every cycle of the oscillator, any charge lost in capacitor C2 is restored. Any charge lost at capacitor C1 is restored by transferring charge from capacitor C2. Because of charge-redistribution limits, capacitor C2 will not transfer all of its charge to capacitor C1. Therefore, multiple cycles of the oscillator are required to charge fully C1 to 7 volts. In actual practice, however, capacitor C1 does not have to be charged to 7 volts. At a lower $V_{C1}$, only one cycle of the oscillator is required to restore lost charge in C1.

Device 15 is an FET diode connected to the substrate $V_{sx}$. Device 15 has a forward drop of approximately 0.4 volts. In the event that the substrate drifts toward ground (0 volts), it passes through approximately $-6.6$ volts and diode device 15 turns on when the oscillator is at 0 volts and transfers charge to the substrate capacitors. The $V_{sx}$ node would then be held at a negative value. If $V_{sx}$ is closer to ground, more charge is transferred from capacitor C1, resulting in a greater current capability.

FIG. 4B shows voltage waveform osc-out, $\overline{osc}$ and osc. As before, osc-out, osc and $\overline{osc}$ represent signals generated at different points on the circuit of FIG. 3. The regulating voltage (REG-OUT) stands at approximately 1.9 volts. At this level REG OUT is high enough to partially turn on devices 6 and 10 (FIG. 3). The partial turn-on causes a voltage drop on devices 5 and 8 respectively. The voltage drop lowers the upper level of osc to approximately 3.5 volts. The lower level on $\overline{osc}$ reduces the drive to device 12. This in turn raises the lower level of oscillator (osc) to approximately 0.5 volts. As stated before, the changes in the amplitude of the osc and $\overline{osc}$ signals affect the charging of capacitors C1 and C2, which in turn control the charge supplied to substrate terminal ($-V_{sx}$).

FIG. 4C gives the voltage waveforms for osc-out, $\overline{osc}$ and osc when the regulating voltage REG-OUT is sitting at approximately 2.1 volts. This sketch shows that, as the regulation voltage REG-OUT rises the upper level $\overline{osc}$ falls further and the lower level of osc rises further. If the output of the regulating circuit increases, a point is reached with $\overline{osc}$ sitting at approximately $V_{dd}$ voltage and osc sitting at 0 volts. At this point the charge-pump amplifier is held completely off. The above clearly shows that by controlling the amplitude of $\overline{osc}$ and osc at nodes 73 and 74, the substrate voltage $-\overline{V_{sx}}$ is regulated.

Figure 2:
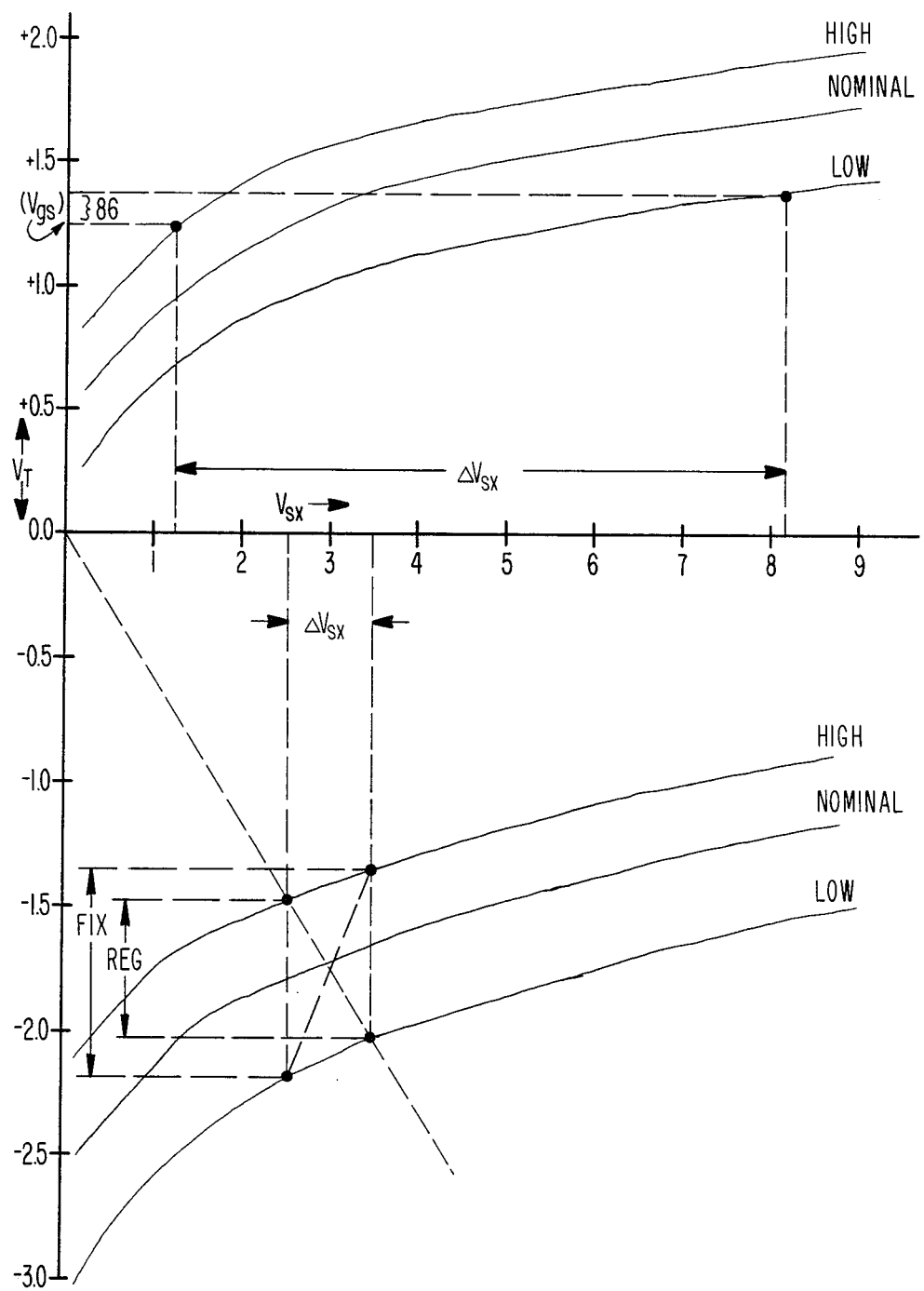
FIG. 2 shows two graphs representing the typical relationship between FET threshold voltage ($V_T$) and source-to-substrate voltage ($V_{sx}$). The upper plot shows the relationship for a device controlled according to the threshold voltage compensation technique and the lower plot shows the relationship for a device controlled according to the teaching of the present invention.

FIG. 2 shows a plot of FET threshold voltage $V_T$ versus substrate voltage ($V_{sx}$). The plot is helpful in visualizing the significant reduction in substrate voltage swing $V_{sx}$ for a device which is controlled in accordance with the present invention, as opposed to a device which is controlled in accordance with the prior-art threshold-voltage compensation technique. $V_{sx}$ is plotted on the horizontal axis, while $V_T$ is plotted on the vertical axis. The curves designated "high" and "low" indicate the threshold-voltage variation around nominal when temperature and device processing tolerance are taken into account.

The upper plot shows a device which is controlled using the prior-art threshold-voltage compensation technique. Window 86, on the vertical axis, includes the range of values of enhancement threshold voltage such that the [$V_{GS} - V_T$] for the sensed device causes the charge pump to be inhibited. As is evident from the plot, the swing in substrate voltage $V_{sx}$ is very wide. Large values of $V_{sx}$ increase the likelihood of junction (avalanche) breakdown, while low values increase FET leakage.

The lower plot represents a device which is controlled according to the present invention. The zones along the $V_T$ axis designated FIX and REG show the variation in values for

[$V_{gs\ device\ 4} - V_{T\ device\ 4}$]

such that device 4 will be off and the charge pump will be inhibited. The dashed line drawn from the origin indicates the voltage division of devices 1 and 2 at node 82 (FIG. 3). The slope of this line is chosen so as to provide the desired nominal substrate voltage. Clearly, $V_{sx}$ for the regulating scheme of the present invention is substantially less than $V_{sx}$ for the prior-art regulating techniques.

There is also a second order effect to further minimize the variation in $V_T$. In FIG. 2, the $V_T$ range marked FIX indicates a possible range of values for $V_T$ when $-V_{sx}$ is fixed, e.g. from an external source. Since the regulator is constrained to operate along the dashed lead line, the $V_T$ can vary only within the smaller range marked REG.

Regulating the substrate voltage has several advantages, some of which are:

(1) It reduces the probability of junction avalanche breakdown.

(2) It provides tighter tolerance over junction-substrate, gate-substrate and wiring-substrate capacitances.

(3) It reduces the threshold-voltage variance below that of a non-controlled substrate generator.

(4) It provides for a natural transition from integrated circuit designs which previously used an external regulated $V_{sx}$ supply to designs incorporated in internal $V_{sx}$ generators.

This particular regulation technique has additional advantages; such as:

(5) It substantially eliminates variations in $V_{sx}$ caused by variations in $V_{dd}$.

(6) It utilizes otherwise objectionable D.C. current into the substrate to advantage.

Having thus described our invention, what we claim as new, and desire to secure by Letters Patent is:

1. A substrate voltage generator for converting a supply voltage of a first polarity to a substrate voltage of an opposite polarity with reference to a ground potential, said generator including an oscillator for producing an alternating voltage from said supply voltage, a charge pump coupled to said oscillator for producing a direct voltage of said opposite polarity, and a regulator for controlling said charge pump so as to resist changes of said direct voltage from a nominal value, characterized in that said regulator comprises:
   a voltage divider means having a pair of depletion-mode FETs coupled between said ground potential and said substrate for obtaining a portion of the voltage difference between said ground potential and said substrate voltage; and
   an amplifier means for coupling an amplified portion of said voltage difference from said voltage divider to said charge pump for controlling said direct voltage.

2. The substrate voltage generator of claim 1 wherein the depletion-mode FETs are coupled to be resistive devices.

3. The substrate voltage generator of claim 1 wherein the amplifier means includes a pair of depletion mode FETs connected in series between the supply voltage and the ground potential.

4. A voltage generator for converting a supply voltage of a first polarity to a bias voltage of a second polarity and applying said second polarity voltage to the substrate of an integrated-circuit device; said voltage generator comprising:
   a first circuit means operable to generating an alternating voltage signal;
   a second circuit means coupled to the first circuit means and operable for converting the alternating voltage signal into a signal for biasing the substrate; and
   a regulator means coupled to the second circuit means and operable to control the second circuit means so as to resist changes of the bias voltage from a nominal value; said
   regulator means having a first pair of depletion-mode FETs connected between a ground potential and the substrate potential and a second pair of FETs configured into a high-gain amplifier with an input connected to the first pair of FETs and an output connected to the second circuit means.

5. The voltage generator of claim 4 wherein the first pair of depletion-mode FETs are connected to form a resistive type voltage divider.

* * * * *